(12) United States Patent
Yamada et al.

(10) Patent No.: US 9,081,920 B2
(45) Date of Patent: Jul. 14, 2015

(54) STRUCTURAL OPTIMIZATION SYSTEM, STRUCTURAL OPTIMIZATION METHOD, AND STRUCTURAL OPTIMIZATION PROGRAM

(75) Inventors: Takayuki Yamada, Nagoya (JP); Shinji Nishiwaki, Kyoto (JP); Kazuhiro Izui, Kusatsu (JP); Masataka Yoshimura, Kyoto (JP)

(73) Assignee: KYOTO UNIVERSITY, Kyoto-shi (JP)

(*) Notice: Subject to any disclaimer, the term of this patent is extended or adjusted under 35 U.S.C. 154(b) by 749 days.

(21) Appl. No.: 13/063,454

(22) PCT Filed: Jul. 17, 2009

(86) PCT No.: PCT/JP2009/062974
§ 371 (c)(1),
(2), (4) Date: Jul. 21, 2011

(87) PCT Pub. No.: WO2010/029810
PCT Pub. Date: Mar. 18, 2010

(65) Prior Publication Data
US 2011/0270587 A1    Nov. 3, 2011

(30) Foreign Application Priority Data
Sep. 11, 2008    (JP) ................................ 2008-233176

(51) Int. Cl.
*G06F 17/00* (2006.01)
*G06F 17/50* (2006.01)
*B81B 3/00* (2006.01)

(52) U.S. Cl.
CPC ........ *G06F 17/5018* (2013.01); *G06F 17/5086* (2013.01); *B81B 3/00* (2013.01)

(58) Field of Classification Search
CPC ............ G06F 17/5018; G06F 17/5086; G06F 2217/11; G06F 2217/06; G06F 2217/08; G06F 2217/12

USPC ............................................................ 703/1
See application file for complete search history.

(56) References Cited

U.S. PATENT DOCUMENTS 7,124,394 B1 * 10/2006 Abrams et al. .................. 716/55
2007/0239411 A1 * 10/2007 Yamashita et al. ................ 703/7

FOREIGN PATENT DOCUMENTS

| JP | 2003-150651 A | 5/2003 |
| JP | 2005258813 A | 9/2005 |

OTHER PUBLICATIONS

Wang et al, "Structural Shape and Topology Optimization in a Level-Set-Based Framework of Region Representation", Struct. Multidisc. Optim. 27, pp. 1-19, 2004.*

(Continued)

*Primary Examiner* — Mary C Jacob
(74) *Attorney, Agent, or Firm* — Alleman Hall McCoy Russell & Tuttle LLP

(57) ABSTRACT

The present invention enables structural optimization having a high degree of freedom, such as the allowance of a change in topology in a material domain $\Omega$, and provides clear expression of the shape of optimum structures. The present invention defines a level set function $\phi$; updates the level set function $\phi$, under a predetermined constraint condition, so as to bring a performance of a structure, such as a rigidity, close to a target value; moves the boundary $\partial\Omega$ between the material domain $\Omega$ and a void domain; allows a change in topology in the material domain $\Omega$, which is associated with the update of the level set function $\phi$, to form a new void domain in the material domain $\Omega$; and moves the boundary $\partial\Omega$ between the new void domain and the material domain $\Omega$.

4 Claims, 10 Drawing Sheets

(56) References Cited

OTHER PUBLICATIONS

Korvink et al, "Multiphysics for Topology Optimization in MEMS", 6th International Conference on Thermal, Mechanical and Multiphysics Simulation and Experiments in Micro-Electronics and Micro-systems, EuroSimE, 2005.*

Malladi et al, "Shape Modeling with Front Propagation: A Level Set Approach", IEEE Transations on Pattern Analysis and Machine Intelligence, vol. 17, No. 2, Feb. 2005.*

Saitou et al, "A Survey of Structural Optimization in Mechanical Product Development", Transactions of the ASME, vol. 5, Sep. 2005.*

Xia et al, "Topology Optimization of Thermoelastic Structures Using Level Set Method", Comput. Mech. 42:837-857, 2008.*

Yamada et al, "Structural Optimization of Compliant Mechanisms Based on the Level Set Method", Abstract, Transactions of JSCES, Paper No. 20080001, Jan. 18, 2008.*

Yamada et al, "Structural Optimization of Compliant Mechanisms Based on the Level Set Method", Transactions of JSCES, Paper No. 20080001, published Jan. 18, 2008, English Translation.*

Allaire et al, "Structural Optimization Using Topological and Shape Sensitivity via a Level Set Method", Control and Cybernetics, vol. 34, No. 1, 2005.*

Wang et al, "An Extended Level Set Method for Shape and Topology Optimization", Journal of Computational Physics, 221, pp. 395-421, 2007.*

ISA Japanese Patent Office, International Search Report of PCT/JP2009/062974, Aug. 18, 2009, 4 pages.

Lin He et al., "Incorporating topological derivatives into shape derivatives based level set methods," Journal of computational Physics, Jul. 1, 2007, vol. 225, Issue 1, pp. 891-909, xx pages.

Martin Burger et al., "Incorporating topological derivatives into shape derivatives into level set methods," Journal of Computational Physics, Feb. 10, 2004, Colume 194, Issue 1, pp. 344-362, xx pages.

Wang, M. Y., Wang, X., and Guo, D., "A Level Set Method for Structural Topology Optimization, Computer Methods in Applied Mechanics and Engineering," vol. 192, (2003), pp. 227-246, 20 pages.

Yamasaki, S., Nishiwaki, S., Yamada, T., Izui, K., and Yoshimura, M., "A Structural Optimization Method Based on the Level Set Method Using a New Geometry-based Re-initialization Scheme," International Journal for Numerical Methods in Engineering, vol. 83, 2010, pp. 1580-1624.

Park, K. S., and Youn, S. K., "Topology Optimization of shell structures using adaptive inner-front (AIF) level set method, Structural and Multidisciplinary Optimization," vol. 36, (2008), pp. 43-58, 16 pages.

Yamada, T., Nishiwaki, S., Izui, K., and Yoshimura, M., "A Study of Boundary Setting in the Design Domain for Structural Optimization Based on the Level Set Method," Transaction of the Japan Society for Industrial and Applied Mathematics, vol. 18, No. 3, 2008, pp. 487-505, 19 pages.

Yamada, Takayuki, et al., "Structural Optimization of Compliant Mechanisms Based on the Level Set Method," Transactions of the Japan Society for Computational Engineering and Science, Jan. 18, 2008, 10 pages.

* cited by examiner (a) DESIGN PROBLEM 1

(b) DESIGN PROBLEM 2

Case1(τ=0.5)   Case2(τ=0.05)   Case3(τ=0.03)

Case1(τ=0.01)   Case2(τ=0.005)   Case3(τ=0.0005)

(A) WITHOUT UNIFORM CROSS-SECTION CONSTRAINT (B) WITH UNIFORM CROSS-SECTION CONSTRAINT (a) INITIAL STRUCTURE (b) $\tau = 5 \times 10^{-4}$    (c) $\tau = 1 \times 10^{-4}$    (d) $\tau = 5 \times 10^{-5}$    (e) $\tau = 1 \times 10^{-5}$

STRUCTURAL OPTIMIZATION SYSTEM, STRUCTURAL OPTIMIZATION METHOD, AND STRUCTURAL OPTIMIZATION PROGRAM

TECHNICAL FIELD

The present invention relates to a structural optimization device, a structural optimization method, and a structural optimization program.

BACKGROUND ART

Conventionally, methods for structural optimization include dimensional optimization, shape optimization, and topology optimization.

Among the above conventional structural optimization methods, shape optimization obtains an optimum structure by using an outer shape as a design variable and updating the outer shape on the basis of sensitivity information, and is widely used in mechanical industries as a practical method.

However, a shape optimization method has an inherent disadvantage, namely, that a change in topology, i.e., a change in the number of holes in an optimum structure, cannot occur, and therefore significant improvement of structural performance cannot be expected.

On the other hand, topology optimization enables the topology of an optimum structure to be changed, by replacing an optimal design problem by a material distribution problem that, when solved, can be expected to provide significant improvement of structural performance.

However, a topology optimization may give rise to a numerical instability problem such as the inclusion of grayscale areas in the optimum structure, namely, areas that are not clearly specified as material or void, which degrades the utility and manufacturability of an obtained optimum structure.

Also, in recent years, as a new structural optimization method, structural optimization based on a level set method, has been proposed (Non-patent Literature 1).

In a level set-based topology optimization method, the outer shape of a structure is represented by a one-dimensional high-level level set function, and a change in shape and configuration is replaced by a change in the level set function value, so as to obtain an optimum structure. On this basis, a level set-based topology optimization method has the advantage of, differently from a conventional topology optimization method, being able to constantly and clearly represent the outline of an optimum structure, and it thereby avoids the occurrence of the numerical problem that leads to the inclusion of grayscale areas.

However, a typical level set-based topology optimization method updates the level set function on the basis of an advection equation, and is therefore based on the assumption that a change in topology (i.e., a change in configuration) such as the introduction of a hole in the material domain is not allowed.

On the other hand, as described in Non-patent Literature 2, a method has been proposed that, during the process of the structural optimization based on the level set method, on the basis of the topological derivatives of an objective function, appropriately introduces a hole, or holes, into the material domain in an arbitrary manner. Also, as described in Non-patent Literature 3, a method has been proposed that, during the optimization process, can replace a material domain (i.e., a domain where a structure is formed), which has a value of a topological derivative equal to a predetermined threshold value, by a void domain (i.e., a domain where a void is formed), and therefore this method allows a change in topology (i.e., a change in configuration) such as the introduction of a hole in the material domain.

However, all of the above-mentioned level set-based topology optimization methods have a problem of being highly dependent on parameter settings, such as the number of holes set in the initial configuration prior to optimization, or the setting of threshold values, and unless such parameters and values are appropriately set, these methods are unable to obtain a physically valid optimum structure (see Non-patent Literature 4).

CITATION LIST

Non-Patent Literature

Non-patent Literature 1: Wang, M. Y., Wang, X., and Guo, D., A Level Set Method for Structural Topology Optimization, Computer Methods in Applied Mechanics and Engineering, Vol. 192, (2003), pp. 227-246.

Non-patent Literature 2: Yamasaki, S., Nishiwaki, S., Yamada, T., Izui, K., and Yoshimura, M., A Structural Optimization Method Based on the Level Set Method Using A New Geometry-based Re-initialization Scheme, International Journal for Numerical Methods in Engineering, Vol. 18, (2008), pp. 487-505.

Non-patent Literature 3; Park, K. S., and Youn, S. K., Topology Optimization of shell structures using adaptive inner-front (AIF) level set method, Structural and Multidisciplinary Optimization, Vol. 36, (2008), pp. 43-58.

Non-patent Literature 4; Yamada, T., Nishiwaki, S., Izui, K., and Yoshimura, M., A Study of Boundary Setting in the Design Domain for Structural Optimization Based on the Level Set Method, Transaction of the Japan Society for Industrial and Applied Mathematics, (submitted).

SUMMARY OF INVENTION

Technical Problem

Therefore, the present invention is made to solve all of the above limitations, and its main desired objective is to enable the shape of an optimum structure to be clearly represented, and a structural optimization that has a high degree of freedom, such as allowing a change in the topology of a material domain, to be performed.

Solution to Problem

That is, the structural optimization device of the present invention is characterized as being provided with the following configurations (1) to (3);

(1) A design domain data storage part that stores design domain data indicating a design domain for a structure;

(2) A level set function data storage part that stores level set function data that indicates a level set function that indicates whether each part of the design domain where an initial structure is set corresponds to a material domain where a structure is formed, a void domain where a void is formed, or a boundary between these two domains, wherein a predetermined value between a value representing the material domain and a value representing the void domain represents the boundary of the structure; and (3) A level set function update part that, under a predetermined constraint condition, updates the level set function so as to bring a performance of the structure, such as a rigidity, close to a target value, and moves the boundary between the material domain and the void domain, allows a change in topology (change in configuration) in the material domain to form a new void domain in the material domain, the change in topology being associated with the update of the level set function, and moves the boundary between the new void domain and the material domain.

If so, the predetermined range between the value representing the material domain and the value representing the void domain is used by the level set function to indicate the boundary between the material domain and the void domain, to be thereby able to clearly represent the shape of an optimum structure. Also, the level set function is updated so as to move the boundary between the material domain and the void domain, and also move the boundary that is newly generated by allowing a change in topology in the material domain, so that a structural optimization that has a high degree of freedom, such as the allowance of a change in the topology of the material domain, can be performed.

As a specific aspect for carrying out the method for updating the level set function, preferably, the level set function update part calculates, using an energy functional whose variables are a set of functions for which the level set function is a variable, an energy density in the material domain, an energy density in the void domain, and an interface energy density, and, according to an energy functional minimization principle, calculates a reaction-diffusion equation indicating the time evolution of the level set function, and uses the reaction-diffusion equation to evolve the level set function in time, and thereby updates the level set function.

Also, preferably, the level set function update part updates the level set function in such a way that the degree of complexity indicating the structural complexity of a structure obtained as a result of updating the level set function is made to approach a preset degree of complexity. If so, among countless local optimum solutions, an optimum structure having a degree of structural complexity (i.e., geometrical fineness) intended by a designer (user) can be created.

Also, the structural optimization method according to the present invention is provided with: a design domain setting step for setting a design domain for a structure; a level set function setting step for setting a level set function that indicates whether each part of the design domain where an initial structure is set corresponds to a material domain where a structure is formed, a void domain where a void is formed, or a boundary between these two domains, wherein a predetermined value between a value representing the material domain and a value representing the void domain represents the boundary of the structure; and a level set function updating step that, under a predetermined constraint condition, updates the level set function so as to bring a performance of the structure, such as a rigidity, close to a target value, and simultaneously varies the configuration and shape of the boundary between the material domain and the void domain.

Furthermore, the structural optimization program according to the present invention is characterized by instructing a computer that is provided with functions that include: a design domain data storage part that stores design domain data indicating a design domain for a structure; a level set function data storage part that stores level set function data that indicates a level set function that indicates whether each part of the design domain where an initial structure is set corresponds to a material domain where a structure is formed, a void domain where a void is formed, or a boundary between these two domains, wherein a predetermined value between a value representing the material domain and a value representing the void domain represents the boundary of the structure; and a level set function update part that, under a predetermined constraint condition, updates the level set function so as to bring a performance of the structure, such as a rigidity, close to a target value, and simultaneously varies the configuration and shape of the boundary between the material domain and the void domain.

Advantageous Effects of Invention

As described, according to the present invention, the shape of an optimum structure can be clearly represented, i.e., the optimum structure is free from grayscale areas, and structural optimization having a high degree of freedom, such as the allowance of a change in topology in a material domain, can be performed.

DESCRIPTION OF EMBODIMENTS

Figure 1:
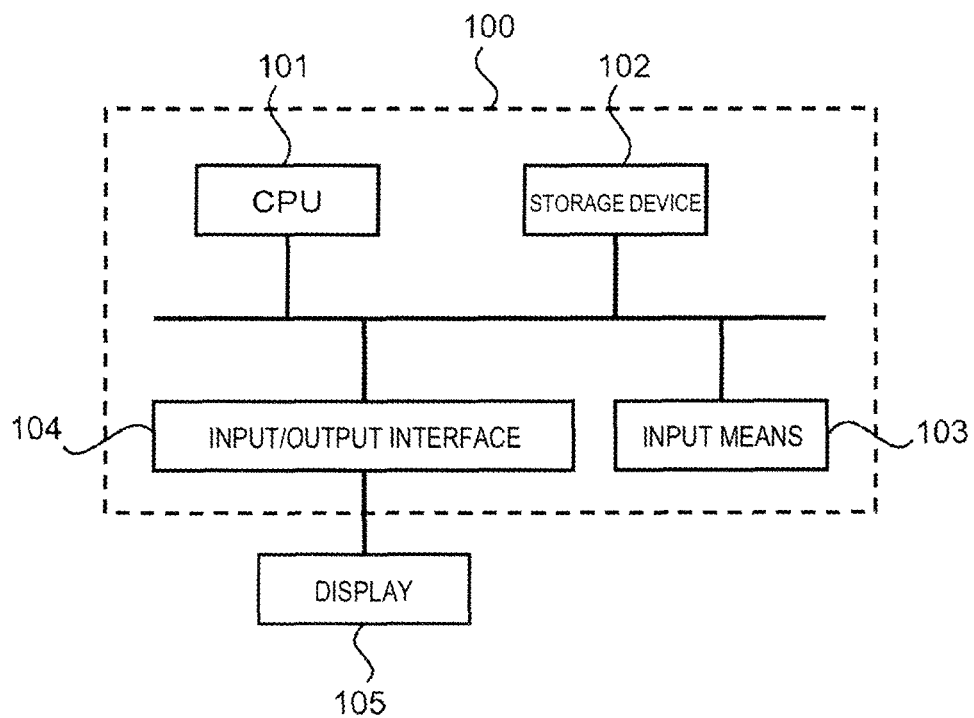
FIG. 1 is a device configuration diagram of the structural optimization device according to the present embodiment.

Next, one embodiment of the present invention is described, referring to the drawings. Here, FIG. 1 is a device configuration diagram of structural optimization device 100 of the present embodiment, FIG. 2 is a functional configuration diagram of the structural optimization device 100, and FIG. 3 is a flowchart illustrating the operation of the structural optimization device 100.

<Device Configuration>

The structural optimization device 100 according to the present embodiment is one that, within a preset design domain, creates a structure that has a desired performance under a predetermined constraint condition, being a general-purpose or dedicated computer that, as illustrated in FIG. 1, is provided with, in addition to a CPU 101, a storage device 102 such as a volatile memory or an HDD, an input means 103 such as a mouse and a keyboard, an input/output interface 104 for connecting output means 105 such as a display and a printer for outputting an analysis model or a calculation result, and the like.

Figure 2:
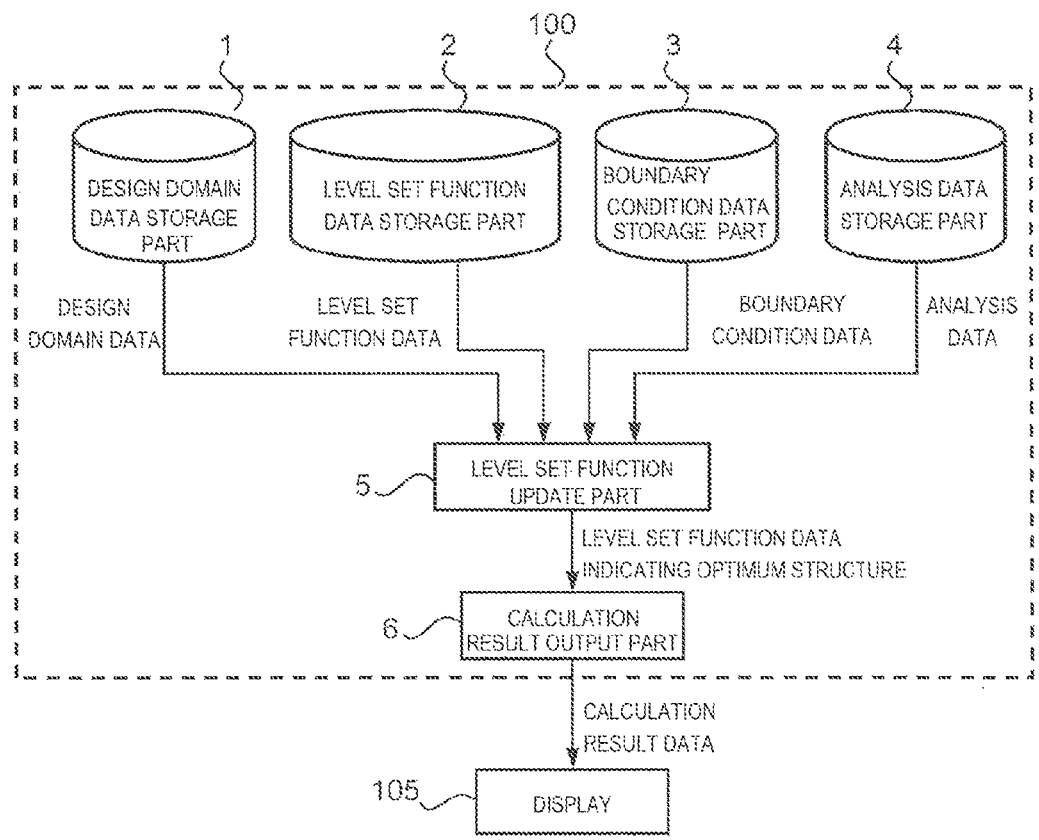
FIG. 2 is a functional configuration diagram of the structural optimization device according to the same embodiment.
Figure 3:
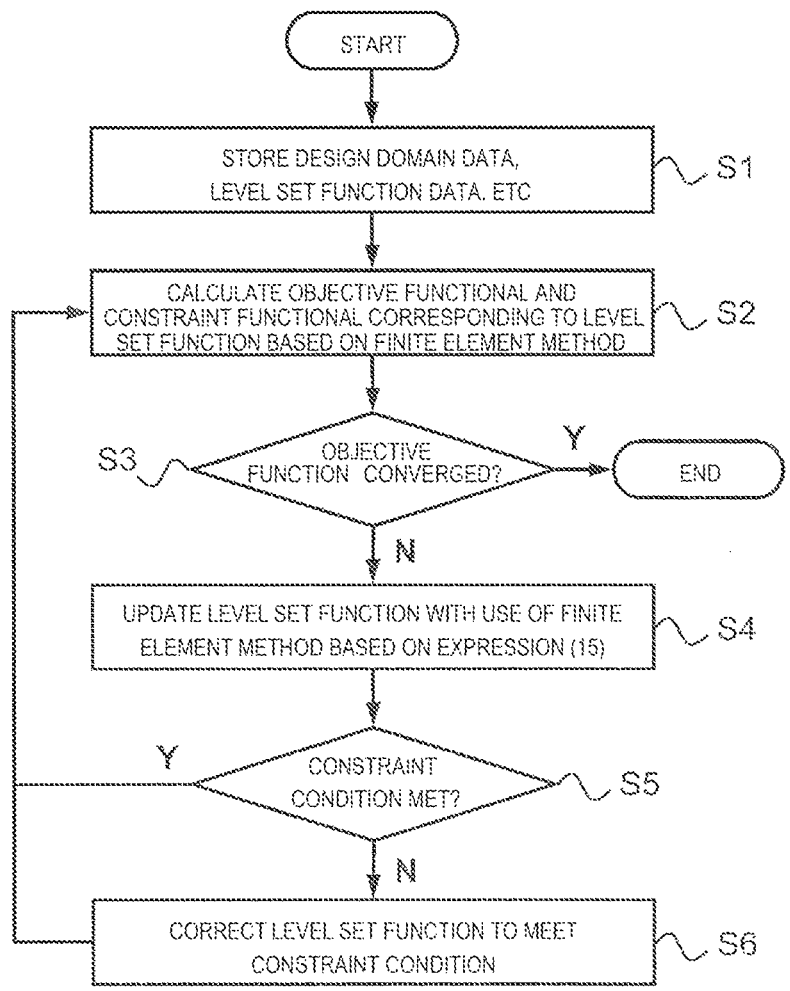
FIG. 3 is a flowchart illustrating the optimization algorithm of the same embodiment.

Also, a predetermined program is installed in the storage device 102 to, on the basis of the program, collaboratively operate the CPU 101 and peripheral devices, and thereby the structural optimization device 100 fulfills functions comprising, as illustrated in the functional configuration diagram of FIG. 2, a design domain data storage part 1, a level set function data storage part 2, a boundary condition data storage part 3, an analysis data storage part 4, a level set function update part 5, a calculation result output part 6, and the like.

In the following, each of the parts is described.

The design domain data storage part 1 is a part that stores pieces of design domain data indicating a design domain for a structure (including information pertaining to a structural grid (i.e., a mesh) that divides the design domain into elements). In addition, the pieces of design domain data are inputted by, for example, a user who uses the input means 103.

The level set function data storage part 2 is a part that stores pieces of level set function data indicating a level set function for identifying a structure in the design domain, such as an initial structure. The level set function refers to a function that indicates whether each part of the design domain where the initial structure is set corresponds to a material domain (material phase) that forms the structure and is occupied by a material, a void domain (void phase) where a void is formed, or a boundary between these two domains, wherein a predetermined value between a value representing the material domain and a value representing the void domain represents the boundary between the material domain and the void domain. In addition, the pieces of level set function data are inputted by, for example, a user who uses the input means 103.

The boundary condition data storage part 3 is a part that stores pieces of boundary condition data indicating boundary conditions of the design domain (hereinafter also referred to as the fixed design domain). The specific boundary conditions include, for example, a constraint condition of the design domain, an external surface force (traction) condition that acts on the initial structure, such as a load, and the like. In addition, the pieces of boundary condition data are inputted by, for example, a user who uses the input means 103.

The analysis data storage part 4 stores pieces of analysis data, including a constraint condition value necessary for a volume constraint used to obtain an optimum structure, and material constants necessary to analyze a displacement field, such as a Young's modulus value and a Poisson's ratio value. In addition, the pieces of analysis data are inputted by, for example, a user who uses the input means 103.

The level set function update part 5 is a part that, under one or more predetermined constraint conditions, updates a level set function so as to bring performances of the structure, such as a rigidity and an eigenfrequency, close to target values; moves the boundary between the material domain and the void domain; and also allows a change in topology (change in configuration) in the material domain, which is associated with the update of the level set function, so as to form a new void domain (i.e., a hole) in the material domain; and moves the boundary between the new void domain and the material domain.

Specifically, the level set function update part 5 calculates, from an energy functional indicated by a function family using the level set function as a variable, an energy density in the material domain, an energy density in the void domain, and an interface energy density, and, according to an energy functional minimization principle, calculates a reaction-diffusion equation indicating the time evolution of the level set function; uses the reaction-diffusion equation to evolve the level set function in time; and thereby updates the level set function. In addition, a specific function of the level set function update part 5 will be described later.

The calculation result output part 6 is a part that outputs a calculation result of the level set function that is updated by the level set function update part 5, i.e., the calculation result output part 6 outputs the shape of the optimum structure, and in the present embodiment, the output is displayed on the display 105.

<Operation of Structural Optimization Device 100>

Next, the operation of the structural optimization device 100 configured as described above is explained, referring to FIG. 3.

First, the user operates the input means 103 to enter the pieces of design domain data, pieces of level set function data, pieces of boundary condition data, and pieces of analysis data. Note that the pieces of level set function data that the user enters specify an initial level set function that indicates an initial structure.

The respective pieces of data entered in this manner are received by a data reception part (not illustrated), and the pieces of design domain data, pieces of level set function data, pieces of boundary condition data, and pieces of analysis data are respectively stored in the design domain data storage part 1, the level set function data storage part 2, the boundary condition data storage part 3, and the analysis data storage part 4 (indicated in Step S1 of the optimization procedure flowchart shown in FIG. 3).

Then (Step S2), the level set function update part 5 calculates, using the finite element method, an objective functional (functional for bringing performances of the structure, such as a rigidity and an eigenfrequency, close to target values) corresponding to the level set function, and a constraint functional (functional indicating the constraint condition or conditions).

Subsequently (Step S3), the level set function update part 5 determines whether or not the value of the objective functional has converged; if the value has converged, it determines that an optimum solution is obtained, completes the optimization, and outputs the current level set function to the calculation result output part 6. On the other hand, if the value has not converged, the finite element method is used to update the level set function (Step S4). At this time, the level set function update part 5 determines whether or not the constraint condition or conditions (e.g., a volume constraint) is met (Step S5), and if the constraint condition is met after the update, the flow of the procedure returns to Step S2. On the other hand, if the constraint condition is not met, a constraint correction method (described later) is used to correct the level set function so that it meets the constraint condition (Step S6), and the flow of the procedure then returns to Step S2. Note that if the volume of the initial structure is extremely different from the volume constraint setting, the value of the volume constraint is altered accordingly during the optimization procedure, during a number of iterations, the number of which can be set, so as to allow the configuration of the structure to change smoothly.

In the following, the method according to the present embodiment is described in detail, and the function of the level set function update part 5 is also described.

<Structural Optimization Problem Based on a Level Set Method>

Figure 4:
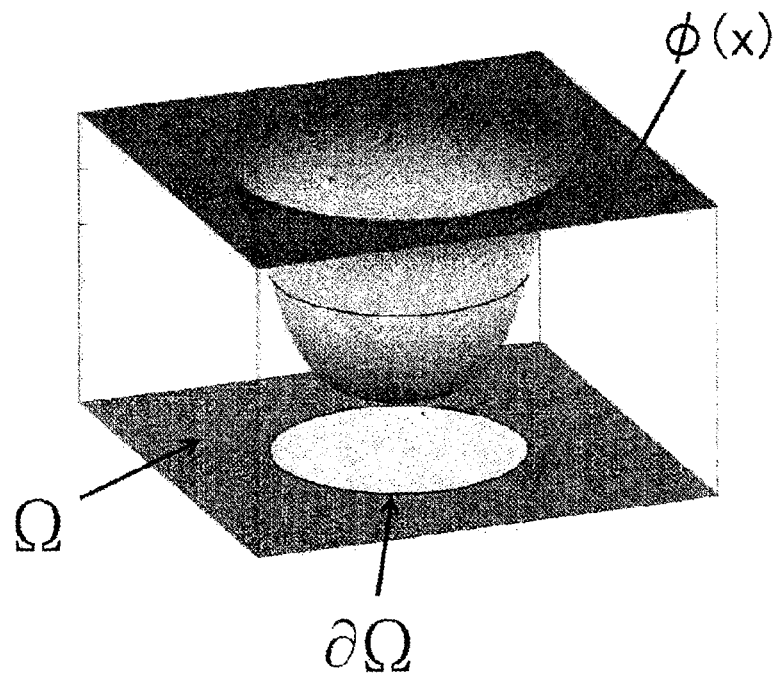
FIG. 4 is a diagram illustrating a material domain, a void domain, and a boundary between these two domains in a level set method.

In a fixed domain D (hereinafter also referred to as a fixed design domain) where the presence of a domain $\Omega$ (hereinafter referred to as a material domain) occupied by a material is allowed, consider the structural optimization of the material domain. A level set method introduces a scalar function $\phi(x)$ referred to as a level set function in the fixed design domain D. A level set method is a method that implicitly represents a material boundary by using the zero iso-surface of the level set function $\phi$ (see FIG. 4).

In the present embodiment, as will be described later, on the basis of the concept of a phase field method, the level set function $\phi$ is evolved in time, and therefore an upper limit and a lower limit are set for the level set function $\phi$, and defined by the following expressions:

[Expression 1]

$$\begin{cases} 1 > \phi(x) > 0 & \text{if } \forall x \in \Omega \setminus \partial\Omega \\ \phi(x) = 0 & \text{if } \forall x \in \partial\Omega \\ 0 > \phi(x) < -1 & \text{if } \forall x \in D \setminus \Omega \end{cases} \quad (1)$$

Note that inside the material domain, the level set function can assume any positive real value without affecting the representation of the structural boundary, and therefore the provision of the above constraints (i.e., upper and lower limits) is allowed.

By using a shape representation based on the level set method, the structural optimization problem is defined by the following expressions:

[Expression 2]

$$\inf_\phi F(\Omega(\phi)) = \int_\Omega f(x) d\Omega \quad (2)$$

$$\text{subject to } G(\Omega(\phi)) = \int_\Omega d\Omega - V_{max} \leq 0 \quad (3)$$

Here, F represents an objective functional, G represents a constraint functional, and $V_{max}$ represents an allowable upper limit percentage of the volume. Also, the objective functional F is an energy functional that is represented by a free energy density in the material domain, a free energy density in the void domain, and an interface energy density. Furthermore, the free energy density is given by a function family $\Omega(\phi)$ that uses the level set function as a variable. This is because the phase of each point (i.e., each point in the material domain or void domain or the boundary between these two domains) is identified by a value of the level set function $\phi$, which gives the free energy density. That is, the free energy density is not an explicit function of the level set function $\phi$, but, rather, is an explicit function of the material shape $\Omega$. Also, this is because, considering the mapping from the level set function $\phi$ to the material shape $\Omega$, the level set function is not uniquely determined at each point.

Conventional topology optimization methods allow an optimum design solution that may include the following: a porous structure in which microvoids are dispersed everywhere; a plate structure in which ribs are arranged at extremely short intervals; a generalized structure such as a mixture of void and material. For this reason, it is impossible to represent a structure smaller than the size of the spatial discretization used in numerical calculations, and therefore the maximum degree of complexity indicating the structural complexity of a structure is preset. Alternatively, the optimization problem should be relieved. For practicality, where manufacturability of an optimum design is desirable, it is preferable to eliminate infinitely fine microstructures and arbitrarily set the degree of complexity of a structure.

In a method for setting the degree of complexity of a structure, based on the concept of the phase field method and minimization of the energy functional, and considering a fictitious interface energy, the degree of complexity (i.e., geometrical fineness) of a structure is implicitly taken into account. That is, the diffusion term of a boundary energy term has a function of eliminating microstructures and thereby setting the degree of complexity of a structure. In the present embodiment, the boundary energy representation of the phase field method is used to implicitly adjust the degree of complexity of a structure. That is, in the present embodiment, in the proposed method for solving the above-described problem, the structural optimization problem expressed in equations (2) and (3) is replaced by an optimization problem of minimizing the sum of the boundary energy and the objective functional given by the following expressions:

[Expression 3]

$$\inf_\phi F(\Omega(\phi), \phi) = \int_\Omega f(x) d\Omega + \int_\Omega \frac{1}{2} \tau |\nabla \phi|^2 d\Omega \quad (4)$$

$$\text{subject to } G(\Omega(\phi)) = \int_\Omega d\Omega - V_{max} \leq 0 \quad (5)$$

Here, the second term of the objective functional F represents the fictitious interface energy. The level set function $\phi$ has the same profile as that of a phase field variable in the phase field method, to thereby represent the boundary energy, and therefore, in equation (1), the upper and lower limits of the level set function $\phi$ are set. Also, $\tau$ represents a parameter that expresses the ratio between the fictitious interface energy and the objective functional F, and is hereafter referred to as a complexity degree coefficient.

<Reaction-Diffusion Equation>

It is difficult to directly obtain the optimum solution $\phi$ of the optimization problem expressed in equations (4) and (5), and therefore the optimization problem is replaced by a problem to solve a time evolution equation with respect to the level set function $\phi$. In conventional level set-based topology optimization methods, the level set function φ is evolved in time on the basis of outer shape sensitivities, according to an advection equation given by the following expression, and shape optimization is thereby performed:

[Expression 4]

$$\frac{\partial \phi}{\partial t} + V_N |\nabla \phi| = 0 \quad (6)$$

Here, $V_N$ represents the normal component of the advection velocity of the material boundary, and this replaces the outer shape sensitivity obtained according to the optimization problem formulation. However, this method is basically a method for shape optimization, and therefore a change in topology such as the introduction of a void domain in a material domain is not allowed. For this reason, methods for introducing a hole in a material domain in an arbitrary manner have been proposed, but the results obtained by these methods are highly dependent on initial parameter settings, and it is difficult to stably obtain an optimum solution using such methods. Furthermore, in a coupled optimization problem of heat flow and structure, or in a coupled optimization problem of a static electric field, heat flow, and structure, it is known from many examination results that a conventional shape optimization method is extremely unstable numerically, and convergence to a solution is poor. For these reasons, it is desirable to replace the optimization problem with a time evolution equation that ensures the smoothness of the level set function φ and allows a change in topology such as the introduction of a hole in a material domain.

Therefore, in the present embodiment, as a method for solving the above-described problems, the concept of the phase field method that represents interface advection on the basis of interface diffusion is employed, and on the basis of the same concept as that of the phase field method, a reaction-diffusion equation, that is, a time evolution equation with respect to the level set function φ, is derived according to the energy functional minimization principle. That is, as given in the following expression, which expresses a driving force that evolves in time, the level set function φ is defined as being proportional to a gradient of the objective functional F:

[Expression 5]

$$\frac{\partial \phi}{\partial t} = -K(\phi) \frac{\delta F}{\delta \phi} \quad (7)$$

Here, $K(\phi) > 0$ represents a proportionality constant, and $\delta F / \delta \phi$ represents a functional variation of the objective functional F. By substituting equation (4) into the above expression, the following expression is obtained:

[Expression 6]

$$\frac{\partial \phi}{\partial t} = -K(\phi) \left( f(x) \frac{d\Omega}{d\phi} H(\phi) - \tau \nabla^2 \phi \right) \quad (8)$$

Here, H(φ) represents a Heaviside function. This implies that the sensitivity dΩ/dφ of the level set function φ with respect to the shape Ω(φ) can be considered as a constant C if the level set function φ is made constant in the material domain Ω. Accordingly, the above expression can be replaced by the following expression:

[Expression 7]

$$\frac{\partial \phi}{\partial t} = -K(\phi)(Cf(x)H(\phi) - \tau \nabla^2 \phi) \quad (9)$$

The proportionality constant K and the complexity degree coefficient τ are parameters, and the constant C can be treated as a parameter provided that the value of C is set so as to make the distribution of the level set function φ steep. Also, concerning the boundary conditions, at boundary $\partial D_N$ (hereinafter also referred to as a non-design boundary) that is preliminarily specified as a material domain boundary, a Dirichlet boundary condition is imposed, whereas at the other boundaries, a Neumann boundary condition is imposed, so that freedom from influences originating outside the fixed design domain D is guaranteed. In this case, the time evolution equation is given by the following expressions:

[Expression 8]

$$\begin{cases} \frac{\partial \phi}{\partial t} = -K(\phi)(C\overline{f}(x)H(\phi) - \tau \nabla^2 \phi) \\ \frac{\partial \phi}{\partial n} = 0 \quad \text{on} \quad \frac{\partial D}{\partial D_N} \\ \phi = 1 \quad \text{on} \quad \partial D_N \end{cases} \quad (10)$$

In addition, in a phase field method, the gradient of the phase field parameters in the time direction is proportional to the gradient of the fixed domain integration for the case in which a function of the phase field variable is used as an integrand, whereas the present embodiment is different in that, in the present embodiment, the gradient of the level set function is proportional to topological derivatives that evolve in time with the level set function φ. As a result, in a conventional phase field method, during the process of time evolution, only advection of the interface is allowed, whereas, according to the method proposed in the present embodiment, a change in topology, such as the creation of a void domain in a material domain, is also allowed. Also, note that the advection equation (6) used in a conventional level set-based topological optimization method does not ensure the smoothness of the level set function φ, whereas the time evolution equation (10) in the present embodiment is a partial differential equation, referred to as the reaction-diffusion equation, and since it includes a diffusion term, the smoothness of the level set function φ is thereby ensured.

Regarding the volume constraint, a method that imposes a volume constraint according to Lagrange's method of undetermined multipliers is used. In this case, given that the Lagrange multiplier is denoted by λ, the time evolution equation (9) is given by the following expression:

[Expression 9]

$$\frac{\partial \phi}{\partial t} = -K(\phi)(C(f(x) + \lambda)H(\phi) - \tau \nabla^2 \phi) \quad (11)$$

$$:= -K(\phi)(C\overline{f}(x)H(\phi) - \tau \nabla^2 \phi)$$

The Lagrange multiplier λ is, if the constraint condition is active, given by:

[Expression 10]

$$\frac{dG(\phi)}{dt} = \int_\Omega \frac{\partial \phi}{\partial t} d\Omega = 0 \qquad (12)$$

Accordingly, from equations (11) and (12), the Lagrange multiplier $\lambda$ is given by the following expression:

[Expression 11]

$$\lambda = -\frac{\int_\Omega K(\phi)(f(x) + \tau \nabla^2 \phi) d\Omega}{\int_\Omega K(\phi) d\Omega} \qquad (13)$$

Also, if the constraint condition is inactive, the Lagrange multiplier $\lambda$ is given by the following expression:

[Expression 12]

$$\lambda = 0 \qquad (14)$$

Using the above equations, the value of the Lagrange multiplier $\lambda$ is obtained to update the level set function $\phi$ from an initial value on the basis of equation (10), and the level set function $\phi$ at the time when the objective functional F converges gives the optimum structure.

Note that it can be confirmed, using the following expression, that in the time evolution case during which the level set function $\phi$ is evolved on the basis of equation (10), the objective functional F monotonically decreases:

[Expression 13]

$$\frac{dF}{dt} = \int_D \frac{\delta F}{\delta \phi} \frac{\partial \phi}{\partial t} dD \qquad (15)$$
$$= \int_D \frac{\delta F}{\delta \phi}\left(-K(\phi)\frac{\delta F}{\delta \phi}\right) dD \;(\because (7))$$
$$= \int_D K(\phi)\left(\frac{\delta F}{\delta \phi}\right)^2 dD < 0$$

In addition, in a conventional phase field method, the energy density is defined as a function with respect to a discriminant function, and therefore the boundary $\partial D$ is advected to thereby monotonically decrease the energy functional. For this reason, during the time evolution process, a change in topology such as the introduction of a void domain in a material domain is not allowed. On the other hand, in the method according to the present embodiment, the introduction of the set of functions $\Omega(\phi)$ makes the representation of a material shape proportional to the topological derivatives, and evolves the level set function $\phi$ in time. Note that as a result, during the time evolution process, in addition to the movement of the boundary $\partial D$, a change in topology that is automatic, not arbitrary, is allowed.

<Mean Compliance Minimization Problem>

Consider a structural problem of, with respect to a fixed design domain D in which a mixture of a material domain filled with a linearly elastic material and a void domain is allowed, completely constraining boundary $\Gamma_u$ during the optimization process, with a traction t acting on boundary $\Gamma_t$ and a body force b acting on the material domain. Note that boundary $\Gamma_u$ is assumed to be fixed to the fixed design domain boundary $\partial D$. In this case, under a volume constraint, the structural optimization problem of minimizing the mean compliance is described by the following expressions:

[Expression 14]

$$\inf_\Omega F(\Omega) = l(u) \qquad (16)$$

$$\text{subject to } a(u,v) = l(v) \text{ for } \forall v \in U \; u \in U \qquad (17)$$

$$G(\Omega) \le 0 \qquad (18)$$

Here, the respective notations in the above expressions are defined in the following expressions:

[Expression 15]

$$a(u,v) = \int_\Omega \epsilon(u):E:\epsilon(v) d\Omega \qquad (19)$$

$$l(v) = \int_{\Gamma_t} t \cdot v d\Gamma + \int_\Omega b \cdot v d\Omega \qquad (20)$$

$$G(\Omega) = \int_\Omega d\Omega - V_{max} \qquad (21)$$

Additionally, $\epsilon$ represents the strain tensor, E represents the elasticity tensor, $V_{max}$ represents the value of a volume constraint, and U represents a displacement function space defined by the following expression:

[Expression 16]

$$U = \{v = v_i e_i : v_i \in H^1(D) \text{ with } v = 0 \text{ on } T_u\} \qquad (22)$$

Note that the boundary $\Gamma_t$ on which the traction acts is constantly required to be a material boundary, and therefore is assumed to be a non-design boundary $\partial D_N$.

Next, KKT conditions for the above optimization problem are derived to give, from the derivation result, a function f(x) that is used to update the level set function $\phi$. On the basis of the above formulation, the Lagrangian $F'(\Omega)$ is described using the Lagrange multiplier $\lambda$ and an adjoint displacement field v, as follows:

[Expression 17]

$$F'(\Omega) = l(u) + a(u,v) - l(v) + \lambda G(\Omega) \qquad (23)$$

When equation (23) is used to derive the KKT conditions, the following expressions are obtained:

[Expression 18]

$$\delta F'(\Omega) = 0, \; a(u,v) - l(v) = 0,$$

$$\lambda G(\Omega) = 0, \; \lambda \ge 0, \; G(\Omega) \le 0 \qquad (24)$$

The level set function $\phi$ that meets the KKT conditions serves as a candidate for the optimum solution (optimum structure). However, it is difficult to directly obtain a level set function $\phi$ that meets these conditions, and therefore, by giving a level set function $\phi$ that serves as an appropriate initial configuration and using equation (11) to update the level set function $\phi$, the sum of the Lagrangian $F'(\Omega)$ and the boundary energy is decreased.

In the following, the function f'(x) that is required when using equation (11) to update the level set function $\phi$, and that gives an objective functional of the Lagrangian, is derived. Here, by defining the adjoint displacement field v as in the following expression, the optimization problem can be replaced by a self-adjoint problem.

[Expression 19]

$$a(v,u) = l(u) \text{ for } \forall u \in U \; v \Sigma U \qquad (25)$$

By substituting equation (25) into equation (23) and then using the equilibrium equations (24), the Lagrangian $F'(\Omega)$ is given by the following expression:

[Expression 20]

$$F'(\Omega) = l(u) + \lambda G(\Omega) \quad (26)$$
$$= a(u, u) + \lambda G(\Omega)$$
$$= \int_{\Omega} (\varepsilon(u) : E : \varepsilon(u) + \lambda) d\Omega$$

Accordingly, the integrand f'(x) that yields the objective functional is given by the following expression:

[Expression 21]

$$f'(x) = \epsilon(u) : E : \epsilon(u) + \lambda \quad (27)$$

<Numerical Solution of Reaction-Diffusion Equation>

As shown in the following expressions, equation (10) is discretized in the time direction by the finite difference method:

[Expression 22]

$$\begin{cases} \dfrac{\phi(t+\Delta t)}{\Delta t} - K(\phi(t))\tau\nabla^2 \phi(t+\Delta t) = \\ -K(\phi(t))Cf'(x,t)H(\phi,t) + \dfrac{\phi(t)}{\Delta t} \\ \phi = 1 & \text{on } \partial D_N \\ \dfrac{\partial \phi}{\partial n} = 0 & \text{on } \dfrac{\partial D}{\partial D_N} \end{cases} \quad (28)$$

Here, $\Delta t$ represents a time increment. Note that by replacing the diffusion term $\tau\nabla^2\phi$ of the first expression in equation (10) with an updated value, a diffusion effect due to the fictitious interface energy is realized, based on the updated value of the level set function $\phi$. Accordingly, in all update steps, the diffusion effect is taken into account.

Next, in order to use the finite element method to perform discretization in the space direction, a weak form of equation (28) is derived, which results in the following expressions:

[Expression 23]

$$\begin{cases} \int_D \dfrac{\phi(t+\Delta t)}{\Delta t} \tilde{\phi} dD + \int_D \nabla^T \phi(t+\Delta t)(\tau K(\phi(t))\nabla\tilde{\phi}) dD = \\ \int_D \left(-K(\phi(t))Cf'(x,t)H(\phi,t) + \dfrac{\phi(t)}{\Delta t}\right)\tilde{\phi} dD & \text{for } \forall \tilde{\phi} \in \tilde{\phi} \\ \phi = 1 & \text{on } \partial D_N \end{cases} \quad (29)$$

Here, $\tilde{\phi}$ is defined by the following expression, and represents a functional space with respect to the level set function $\phi$:

[Expression 24]

$$\tilde{\Phi} = \{\phi \in H^1(D) \text{ with } \phi = 1 \text{ on } \partial D_N\} \quad (35)$$

By using the finite element method to discretize equation (29), the following expressions are obtained:

[Expression 25]

$$\begin{cases} T\Phi(t+\Delta t) = Y \\ \phi = 1 \text{ on } \partial D_N \end{cases} \quad (36)$$

Here, $\Phi(t)$ is a vector formed by a level set function value at each nodal point at time t, and the matrix T and the vector Y are respectively given by the following expressions:

[Expression 26]

$$T = \bigcup_e \int_{V_e} \left(\dfrac{1}{\Delta t} N^T N + \nabla^T N K(\phi(t))\tau \nabla N\right) dV_e \quad (37)$$

$$Y = \bigcup_e \int_{V_e} \left(-K(\phi(t))s(x,t) + \dfrac{\phi(x,t)}{\Delta t}\right) N \, dV_e \quad (38)$$

In the present embodiment, the level set function $\phi$ is updated on the basis of an implicit method, and therefore no limitation based on a CFL (Courant, Friedrich, Levy) condition is present with respect to the time increment $\Delta t$. As a result, when the value of the time increment $\Delta t$ is increased, the problem of a gradually decreasing velocity of boundary movement is not encountered. Note that within approximately the first 20 update steps, the time increment $\Delta t$ is adjusted so that the maximum value of the variation of the level set function $\phi$ becomes approximately equal to 1, and then this time increment is gradually increased.

<Approximate Analytical Method for Displacement Field Based on Eulerian Coordinate System>

In order to update the level set function $\phi$, the displacement field must be analyzed in the material domain. When the material domain is analyzed on the basis of a Lagrangian coordinate system, problems occur when a material shape is different at each update step, which requires the mesh to be sequentially created and a discretely obtained displacement field to be mapped onto the fixed design domain D. Furthermore, if, during the optimization process, an island material domain appears, that is, a material domain not connected to a boundary where the displacement is fixed, a problem occurs because this island domain enters a rigid body mode. For these reasons, the present embodiment uses an Eulerian coordinate system so that the void domain is replaced by a weak material, that is, a material that has a small longitudinal elastic modulus, so that approximation is performed near the structural boundary based on the assumption that the small longitudinal elastic modulus changes spatially in a smooth manner. That is, by replacing equilibrium equation (24) with the following expression, the displacement field can be analyzed without explicitly extracting a material shape:

[Expression 27]

$$\int_D \epsilon(u):E:\epsilon(v)H_e(\phi)d\Omega = \int_D b \cdot v H_e(\phi)d\Omega + \int_{\Gamma_t} t \cdot v d\Gamma \quad (39)$$

Here, $H_e(\phi)$ is a function described by the following expression:

[Expression 28]

$$H_e(\phi) = \begin{cases} d & (\phi < -t) \\ \dfrac{1+d}{2} + \left(\dfrac{15}{16}\phi - \dfrac{5}{8}\phi^3 + \dfrac{3}{16}\phi^5\right)(1-d) & (-t < \phi < t) \\ 1 & (\phi > t) \end{cases} \quad (40)$$

Here, d represents the relative value (i.e., the ratio) of the longitudinal elastic modulus of the void domain to the longitudinal elastic modulus of the material domain, and t represents a value indicating the transition width of the material constant, both of which are set to sufficiently small values. Furthermore, the volume constraint function $G(\Omega)$ is also obtained, using the following approximation:

[Expression 29]

$$G(\phi) = \int_D H_e(\phi) d\Omega - V_{max} \quad (41)$$

<Details of Implementation Method>

The parameter $K(\phi)$ is a function with respect to the level set function $\phi$, and the value of $K(\phi)$ therefore determines the degree of priority between the movement of the boundary $\partial D$ and a change in structural configuration (i.e., a change in topology). That is, setting the value of $K(\phi)$ near the structural boundary to be large corresponds to giving priority to the movement of the boundary $\partial D$ over a change in topology. The results of many calculations demonstrate that the same optimum structure is obtained independently of the parameter $K(\phi)$ setting. Concerning this point, results are described in the respective numerical examples that follow, for the case of $K_1(\phi)=1$ (constant), and for the case of a Gaussian distribution in the neighborhood of $\phi=0$, i.e., $K_2(\phi)=\exp(-\phi^2)$. In addition, in the case of $K_1(\phi)=1$, $K(\phi)$ is constant independently of $\phi$, and therefore the degrees of priority pertaining to the movement of the boundary $\partial D$ and pertaining to a change in topology are comparable, whereas in the case of $K_2(\phi)$, the value near $\phi=0$ is large, and therefore priority is given to the movement of the boundary $\partial D$.

Also, when the volume constraint is taken into account on the basis of Lagrange's method of undetermined multipliers, the numerical error with respect to the volume constraint in each of the update steps is minute, but, because calculations are iteratively performed, there occurs a problem that such numerical errors accumulate, and the volume constraint is thereby not satisfied. For this reason, during the optimization procedure of the method according to the present embodiment, when the volume constraint is not satisfied, the level set function $\phi$ is corrected to meet the volume constraint condition (see S6 in FIG. 3). In the present embodiment, a minimum value of a minute value $\Delta\phi(x)$ that conforms to the following expression is obtained, using a bisection method, and $\phi(x)+\Delta\phi(x)$ is newly set as the value of the level set function $\phi$, as given in the following expression:

[Expression 30]

$$G(\phi(x)+\Delta\phi(x)) \le 0 \quad (42)$$

Numerical Examples

Next, the structural optimization device 100 of the present embodiment is used to examine the validity of the above-described optimization method.

Figure 5:
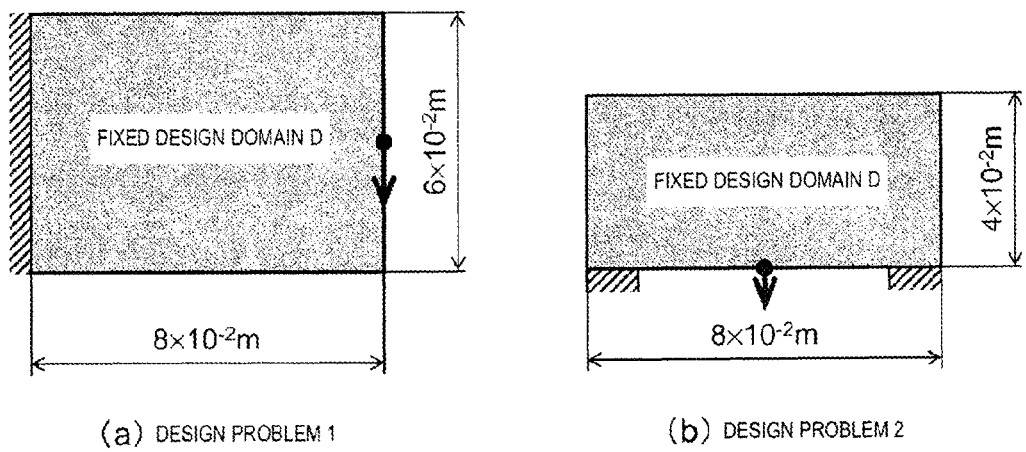
FIGS. 5(a) and 5(b) are diagrams illustrating the design domain and boundary conditions in the design problem 1, and the design domain and boundary conditions in the design problem 2.

FIG. 5(*a*) illustrates the fixed design domain D and boundary conditions in the design problem 1. The fixed design domain D is set as a rectangular domain having a size of $8\times10^{-2}$ m $\times 6\times10^{-2}$ m, and this domain is divided into square-shaped elements by a structural grid having an element length of $5\times10^{-4}$ m. Also, the allowable maximum volume value $V_{max}$ is set to be 40% of the fixed design domain D. The boundary conditions are set such that the left-hand side is completely constrained in displacement, and a downward traction is made to act at the center of the right-hand side.

FIG. 5(*b*) illustrates the design domain D and boundary conditions in the design problem 2. The fixed design domain D is set as a rectangular domain having a size of $8\times10^{-2}$ m $\times 6\times10^{-2}$ m, and this domain is divided into square-shaped elements by a structural grid having an element length of $5\times10^{-4}$ m. Also, the allowable maximum volume value $V_{max}$ is set to be 50% of the fixed design domain D. The boundary conditions are set such that the left-hand part of the lower side and the right-hand part of the lower side are completely constrained in displacement, and a downward traction is made to act at the center of the lower side.

In the cases of design problems 1 and 2, four-node isoparametric quadrilateral plane stress elements are used for the displacement field analyses and to update the level set function $\phi$. As an analysis model material for these cases, an isotropic material is assumed, and as material constants, the longitudinal elastic modulus (i.e., Young's modulus) and Poisson's ratio are respectively set to 210 GPa and 0.3. Furthermore, the ratio of the longitudinal elastic modulus of the void domain to the longitudinal elastic modulus of the material domain, which is defined in equation (35), is set to $1\times10^{-6}$, and the value t of the implicit transition width is set 0.1.

<Comparison of Results Obtained with Different Values of Parameter $K(\phi)$>

First, a comparison of different values set for parameter $K(\phi)$ is made.

Under the conditions that the initial structure is set as a structure in which the upper two-thirds of the fixed design domain D is filled with material, the complexity degree coefficient $\tau$ is set to 0.07, and C is set so that $C=1/\max(f(x))$, the optimization is performed on the design problem 1.

Figure 6:
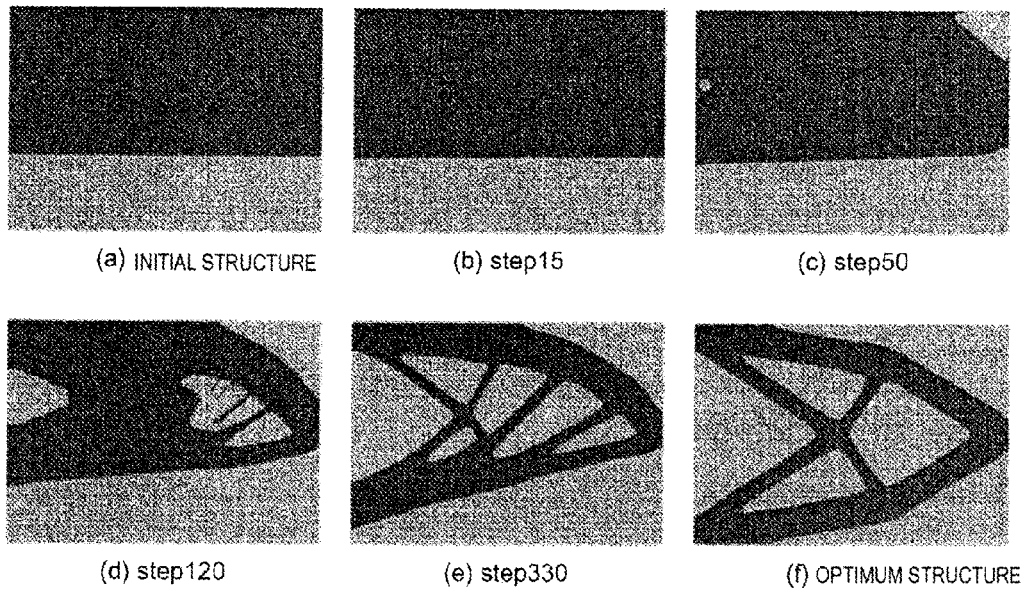
FIGS. 6(a) to 6(f) are diagrams illustrating the initial structure, intermediate structures during the process of optimization, and the optimum structure for the case of $K_1(\phi)=1$.
Figure 7:
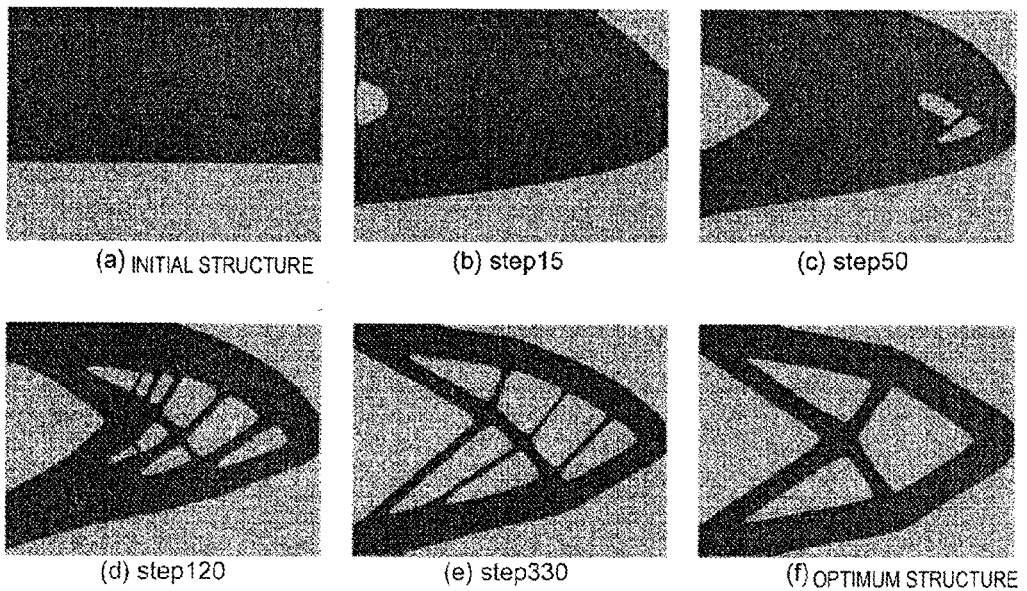
FIGS. 7(a) to 7(f) are diagrams illustrating the initial structure, intermediate structures during the process of optimization, and the optimum structure for the case of $K_2(\phi)=\exp(-\phi^2)$.

The initial structure, structures during the optimization process (i.e., intermediate results), and the optimum structure for the case of $K_1(\phi)=1$ are illustrated in FIG. 6. In the same manner, the initial structure, structures during the optimization process, and the optimum structure for the case of $K_2(\phi)=\exp(-\phi^2)$ are illustrated in FIG. 7. In FIGS. 6 and 7, black areas correspond to the material domain, and gray areas correspond to the void domain. When the results shown in FIGS. 6 and 7 are compared, it is clear that the appearance of the structures during the optimization process of the two optimizations is different. The results shown in FIG. 7, for the optimization in which priority was given to the movement of boundary $\partial D$, indicate that boundary $\partial D$ moved faster than it did as shown in FIG. 6 that shows the optimization in which priority was given to changes in topology. However, a comparison of FIGS. 6 and 7 shows that the finally obtained optimum structures are practically identical, and that a clear and physically valid result is obtained in both cases.

<Comparison of Results Obtained with Different Initial Structures>

Next, different initial structures are set prior to performing the optimization procedure on the design problem 1.

Figure 8:
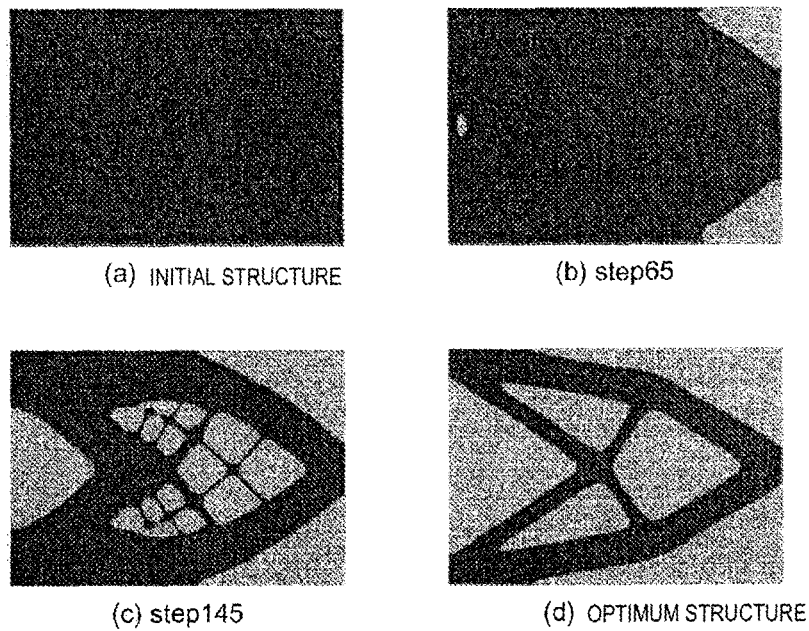
FIGS. 8(a) to 8(d) are diagrams illustrating the initial structure, intermediate structures during the process of optimization, and the optimum structure in Case 1 for comparing the effect of initial structure settings.
Figure 9:
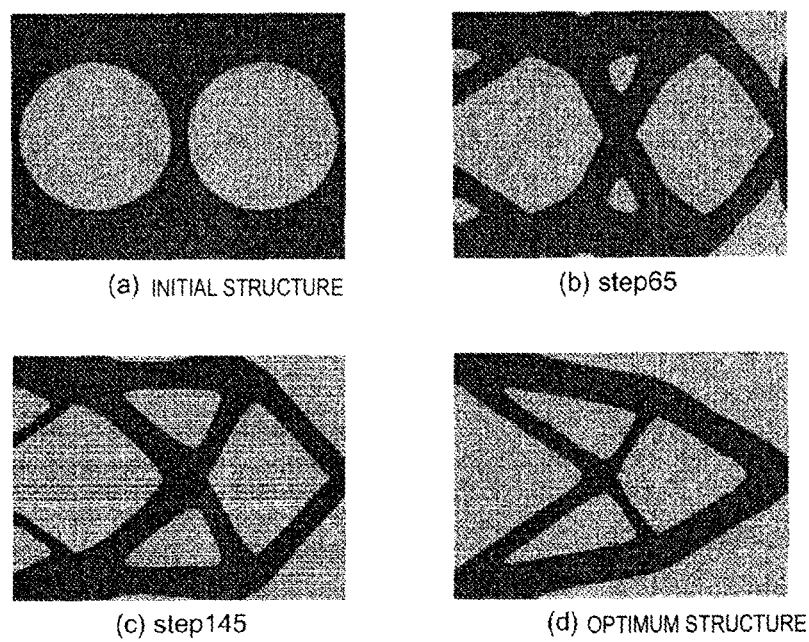
FIGS. 9(a) to 9(d) are diagrams illustrating the initial structure, intermediate structures during the process of optimization, and the optimum structure in Case 2 for comparing the effect of initial structure settings.

The initial structure for Case 1 is, as illustrated in FIG. 8(*a*), set as a structure in which the entire fixed design domain D is filled with material, and the initial structure for Case 2 is, as illustrated in FIG. 9(*a*), set as a structure in which two holes are formed in the initial structure described for Case 1. Also, for both Case 1 and Case 2, the complexity degree coefficient $\tau$ is set to 0.07, and other parameters are set so that $K_1(\phi)=1$ and $C=1/\max(f(x))$. FIGS. 8(*b*) and (*c*), and 9(*b*) and (*c*), illustrate intermediate structures during the optimization process, and FIGS. 8(*d*) and 9(*d*) illustrate the optimum structures. A comparison of these figures shows that the finally obtained optimum structures are practically identical, and that both results are physically valid structures.

<Comparison of Results Obtained when Using Different Values of the Complexity Degree Coefficient $\tau$>

Next, the value of the complexity degree coefficient $\tau$ is set to different values prior to performing the optimization for the design problems 1 and 2.

In this comparison, the initial structure is set as a structure in which the entire fixed design domain D is filled with material, and $K_1(\phi)$ and C are respectively set so that $K(\phi)=1$ and $C=1/\max(f(x))$. Also, in the design problem 1, regarding the complexity degree coefficient $\tau$, the set value in Case 1, Case 2, and Case 3 is 0.5, 0.05, and 0.03, respectively. On the other hand, in the design problem 2, the set value of $\tau$ in Case 1, Case 2, and Case 3 is 0.01, 0.005, and 0.0001, respectively. Note that, in these design problems, as the set value of the complexity degree coefficient is made smaller, a more complex (i.e., more detailed) structure is allowed as the optimum solution.

Figure 10:
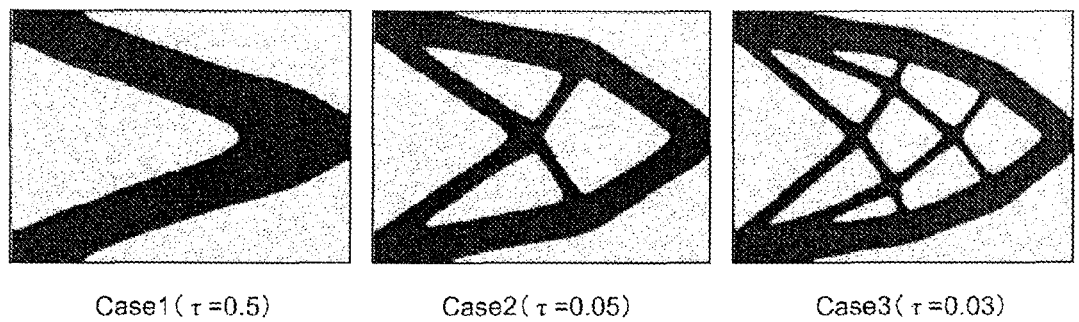
FIG. 10 is a diagram illustrating a comparison of coefficient settings that affect the complexity of the optimum structure in the design problem 1.
Figure 11:
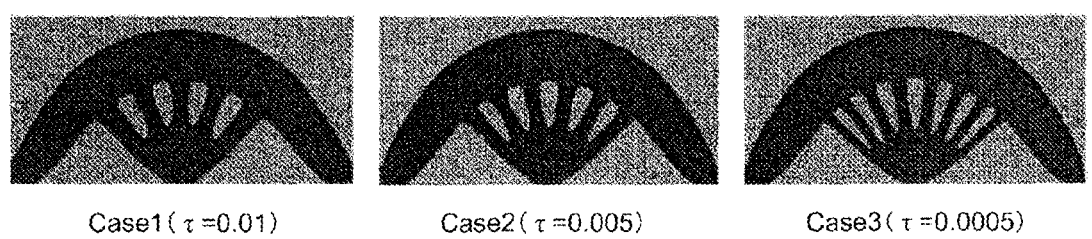
FIG. 11 is a diagram illustrating a comparison of coefficient settings that affect the complexity of the optimum structure in the design problem 2.

FIG. 10 illustrates optimum structures in Case 1, Case 2, and Case 3 for the design problem 1, and FIG. 11 illustrates optimum structures in Case 1, Case 2, and Case 3 for the design problem 2. These illustrations show that a physically valid optimum structure is obtained in all cases. Furthermore, the results demonstrate that optimum structures with different degrees of geometrical complexity can be obtained, depending on the set value of the complexity degree coefficient $\tau$. Accordingly, the proposed optimization method in the present embodiment can implicitly obtain a desired degree of complexity of a structure by setting the complexity degree coefficient to an appropriate value, since the method can adjust the degree of complexity of an optimum structure.

<Optimization Including an Additional Manufacturing Constraint (a Uniform Cross-Section Constraint)>

Figure 12:
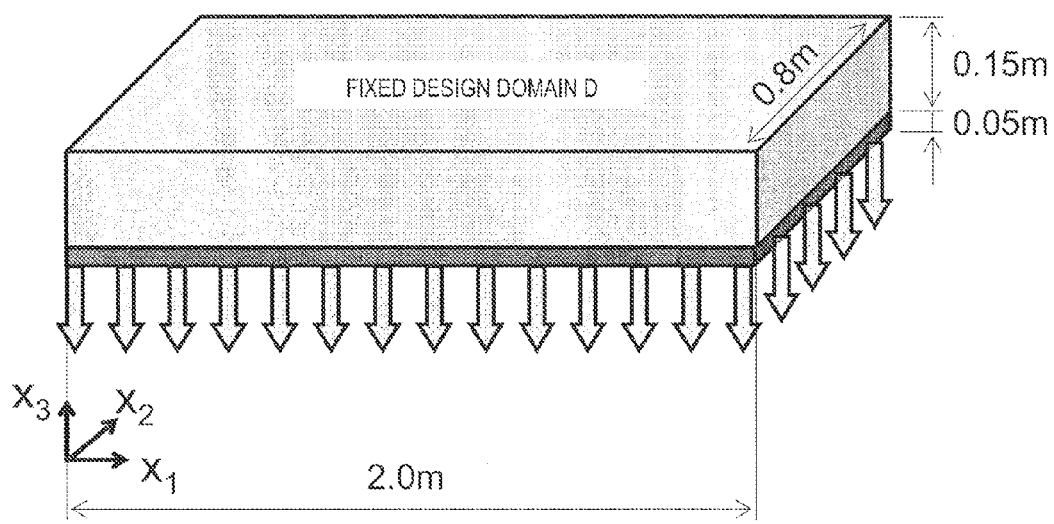
FIG. 12 is a diagram illustrating the design domain and boundary conditions in an optimization problem for the case of adding a uniform cross-section constraint.

FIG. 12 illustrates the design domain and boundary conditions of the optimization for a case in which a uniform cross-section constraint is provided. The fixed design domain D is set as a rectangular parallelepiped domain having a size of 2.0 m×0.8 m×0.15 m, and beneath it is set a non-design domain formed in a rectangular parallelepiped shape having a size of 2.0 m×0.8 m×0.05 m. The boundary conditions are set such that both edges in the longer direction are completely constrained in displacement, and a downward traction is made to act on the entire lower surface of the non-design domain.

In this case, a geometric constraint is added such that the optimum structure has a uniform cross-section in the $X_3$ direction. Specifically, the complexity degree coefficient $\tau$ is set so as to be anisotropic along three axes, so that the value of the complexity degree coefficient in the uniform cross-section direction is set to be much larger than the value of the complexity degree coefficient set along the other axes. That is, among complexity degree coefficient $\tau(X_1)$, $\tau(X_2)$, and $\tau(X_3)$ in their respective axial directions, $\tau(X_3)$ is set to be sufficiently larger than $\tau(X_1)$ and $\tau(X_2)$, i.e., $\tau(X_3) \gg \tau(X_1)$, $\tau(X_2)$.

Figure 13:
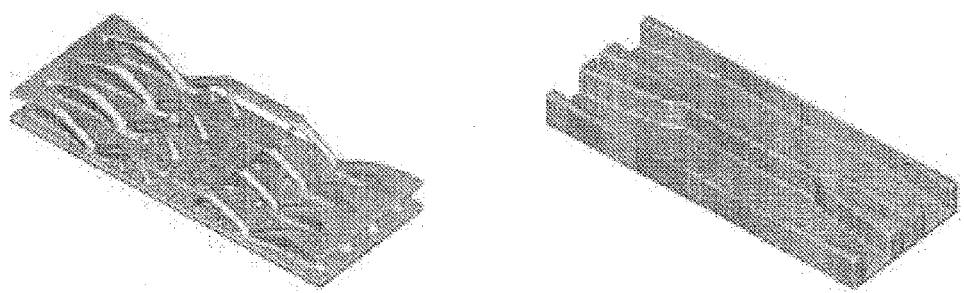
FIGS. 13(a) and 13(b) are diagrams illustrating optimum structures for the cases of not adding and adding the uniform cross-section constraint, respectively.

FIG. 13 illustrates the optimum structures for case (A) "without uniform cross-section constraint" and for case (B) "with uniform cross-section constraint". These diagrams illustrate that by setting appropriate values of the complexity degree coefficient, i.e., by ensuring that $\tau(X_3) \gg \tau(X_1), \tau(X_2)$, an optimum structure that incorporates a uniform cross-section constraint is obtained.

<Heat Diffusion Problem>

In the above comparative examples and the like, the proposed optimization method in the present embodiment is applied to rigidity maximization problems; however, the method can also be applied to heat diffusion problems. Among various heat diffusion problems, the method in the present embodiment can be effective applied in heat conduction problems, heat transfer problems, and internal heat generation problems.

In the following, as specific examples, a heat transfer problem and an internal heat generation problem are described.

<Formulation of Heat Diffusion Maximization Problem>

With respect to a fixed design domain D that includes a material domain filled with a material that conducts heat linearly, and a void domain, consider a heat diffusion maximization problem in which a temperature $T_0$ is provided at a boundary $\Gamma_t$, and a heat transfer boundary having a heat transfer coefficient h at boundary $\Gamma_h$, a heat flux boundary having a heat flux q at boundary $\Gamma_q$, and an internal heat generation Q in the fixed design domain D are given. In addition, it is assumed that boundaries $\Gamma_t$ and $\Gamma_q$ are set on boundary $\partial D$ of the fixed design domain D. Also, boundary $\Gamma_h$ is set on a boundary of the material domain inside the fixed design domain, and this boundary is changed during the optimization process, based on the value of the level set function, which serves as a design variable. In this case, the heat diffusion maximization problem is formulated as a total potential energy maximization problem given by the following expressions:

[Expression 31]

$$\inf_\phi F(\Omega(\phi)) = -\left(\frac{1}{2}a(u_t, u_t) - l(u_t)\right) \tag{43}$$

$$\text{subject to } a(u_t, v_t) = l(u_t) \text{ for } \forall v_t \in U \; u_t \in U_t \tag{44}$$

$$G(\Omega(\phi)) \leq 0 \tag{45}$$

Here, respective notations in the above expressions are defined by the following expressions:

[Expression 32]

$$a(u_t, v_t) = \int_{\Omega(\phi)} \nabla u_t \kappa \nabla v_t d\Omega \tag{46}$$

$$l(v_t) = \int_{\Gamma_q} qv_t d\Gamma + \int_D Qv_t d\Omega + \int_{\Gamma_t(\phi)} h(u_t - T_{amb})v_t d\Gamma \tag{47}$$

$$G(\Omega(\phi)) = \int_{\Omega(\phi)} d\Omega - V_{max} \tag{48}$$

Furthermore, $\kappa$ and $T_{amb}$ respectively represent a heat conduction tensor and an ambient temperature, and $U_t$ represents a temperature function space defined by the following expression:

[Expression 33]

$$U_t\{v_t \in H^1(D) \text{ with } v_t = T_0 \text{ on } T_u\} \tag{49}$$

In addition, in equation (43), the total potential energy term is prefixed with a minus sign, which changes the formulation of the objective functional so that the original maximization problem is replaced by a minimization problem.

<Numerical Example of Heat Diffusion Problem (Heat Transfer Problem)>

Figure 14:
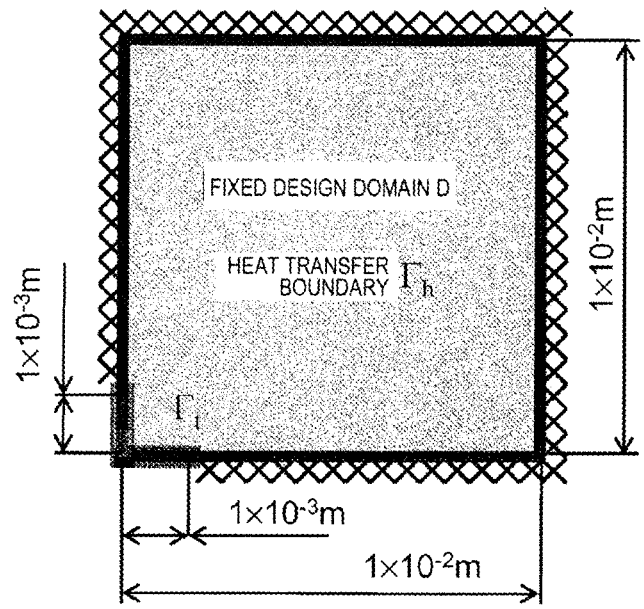
FIG. 14 is a diagram illustrating the design domain and boundary conditions in a heat transfer problem.
Figure 15:
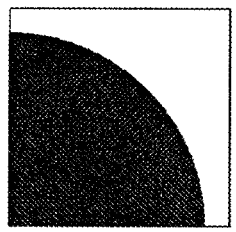
FIGS. 15(a) to 15(e) are diagrams illustrating the initial structure and optimum structures that have different degrees of complexity obtained according to different coefficient settings in the heat transfer problem.
Figure 15:
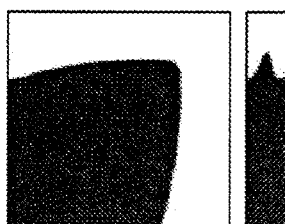
Figure 15:
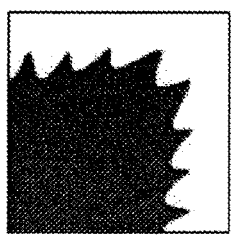
Figure 15:
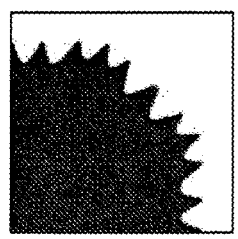
Figure 15:
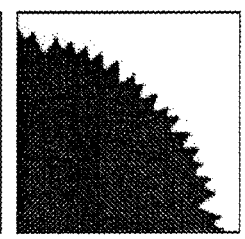

FIG. 14 illustrates the design domain and the boundary conditions. The fixed design domain is set as a square domain having a size of $1 \times 10^{-2}$ m×$1 \times 10^{-2}$ m, and is divided into elements by a structural grid having an element length of $5.0 \times 10^{-5}$ m. As illustrated in the diagram, the lower part of the left-hand side and the left-hand part of the lower side are set to have a temperature of $T_0 = 50°$ C. provided, and an adiabatic boundary condition is imposed at the rest of the boundary. Also, inside the fixed design domain, the heat transfer boundary is given under conditions whereby heat transfer coefficient h=0.1 W/(m²K) and ambient temperature $T_{amb} = 25°$ C. The allowable maximum volume value $V_{max}$ is set to be 60% of the fixed design domain. Also, in order to define the heat transfer boundary, at least one boundary between the material domain and the void domain is required in the initial structure, and therefore, as illustrated in FIG. 15(a), the initial structure is set as a quarter of a circle whose center is at the lower left corner.

FIGS. 15(b) to (e) illustrate optimum structures obtained in the cases where the complexity degree coefficient $\tau$ is set to $5 \times 10^{-4}$, $1 \times 10^{-4}$, $5 \times 10^{-5}$, and $1 \times 10^{-5}$, respectively. FIGS. 15(b) to (e) show that the complexity of the fin shapes, i.e., the geometric fineness of the optimum structures, is varied depending on the set value of the complexity degree coefficient. Also, the figures show that a physically valid optimum structure is obtained in all cases.

<Numerical Example of Heat Diffusion Problem (Internal Heat Generation Problem)>

Figure 16:
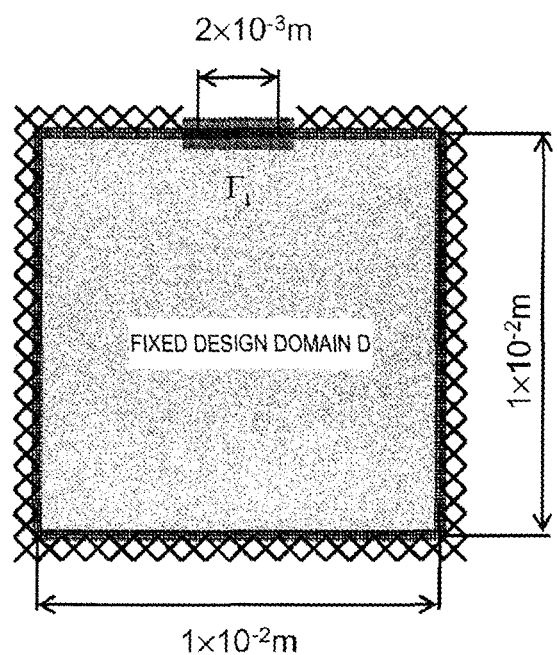
FIG. 16 is a diagram illustrating the design domain and boundary conditions in an internal heat generation problem.
Figure 17:
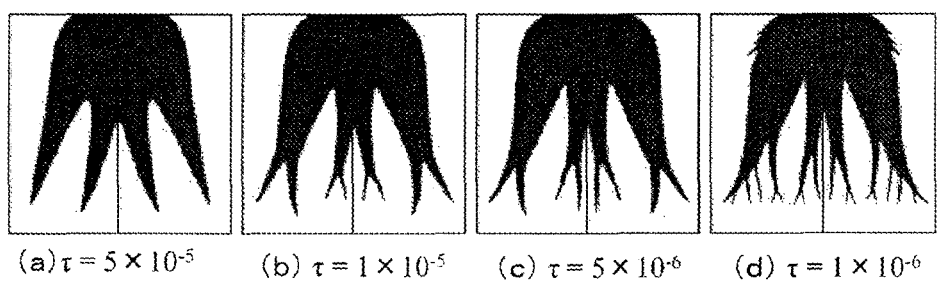
FIGS. 17(a) to 17(d) are diagrams illustrating optimum structures that have different degrees of complexity obtained according to different coefficient settings in the internal heat generation problem.

FIG. 16 illustrates the design domain and boundary conditions for the heat diffusion problem. The fixed design domain is set as a square domain having a size of $1\times10^{-2}$ m$\times 1\times10^{-2}$ m, and is divided into elements by a structural grid having an element length of $2.5\times10^{-5}$ m. As illustrated in FIG. 16, the central part of the upper side is set to have a temperature of $T_0=25°$ C., and an adiabatic boundary condition is imposed at the rest of the boundary. Also, inside the fixed design domain, a heat source of $Q=1.0\times10^{-7}$ W/m$^3$ is given, and the allowable maximum volume $V_{max}$ is set to be 40% of the fixed design domain. Also, the initial structure is set as a structure in which the entire fixed design domain is filled with material. In this case, in order to examine the relationship between set values of the complexity degree coefficient $\tau$ and the optimum structure results, different values of $\tau$ are set prior to performing the optimization.

FIGS. 17(a) to (d) illustrate the optimum structures obtained in the cases when the complexity degree coefficient $\tau$ is set to $5\times10^{-5}$, $1\times10^{-5}$, $5\times10^{-6}$, and $1\times10^{-6}$, respectively. In addition, since the design domain is bilaterally symmetric, optimization analysis is performed only on the right half. The results show that, even in this design problem, the complexity of the optimum structure is varied depending on the setting of the complexity degree coefficient. Also, a physically valid optimum structure is obtained in all of these cases.

Effects of the Present Embodiment

Concerning the structural optimization device 100 configured as described according to the present embodiment, a predetermined value that is set between the value representing the material domain $\Omega$ and the value representing the void domain is used in the level set function $\phi$ to indicate the boundary $\partial D$ between the material domain $\Omega$ and the void domain, and the shape of an optimum structure is thereby clearly represented. Also, the level set function $\phi$ is updated so as to move the boundary $\partial D$ between the material domain $\Omega$ and the void domain, and also move the boundary $\partial D$ that is newly generated by allowing a change in topology in the material domain $\Omega$, and thereby, a structural optimization having a high degree of freedom, such as the allowance of a change in topology in the material domain $\Omega$, can be performed.

Note that it should be appreciated that the present invention is not limited to the above embodiment, and that various modifications can be made to it without departing from the scope of the present invention.

For example, the structural optimization device of the above embodiment is one that is here applied to a rigidity maximization problem or a heat diffusion maximization problem, but it can also be applied to various other structural problems such as, in addition, an eigenfrequency maximization problem.

INDUSTRIAL APPLICABILITY

By applying the present invention, the shape of an optimum structure can be clearly represented, and structural optimization having a high degree of freedom such as the allowance of a change in topology in a material domain $\Omega$ can be performed.

REFERENCE SIGNS LIST

100: Structural optimization device
D: Design domain
$\Omega$: Material domain
$\partial\Omega$: Domain boundary
$\phi$: Level set function
1: Design domain data storage part
2: Level set function data storage part
5: Level set function update part

The invention claimed is:

1. A structural optimization device comprising:
a CPU; and
a storage device configured with:
    a design domain data storage part that stores design domain data indicating a design domain for a structure; and
    a level set function data storage part that stores level set function data that indicates a level set function that indicates whether each part of the design domain where an initial structure is set corresponds to a material domain where a structure is formed, a void domain where a void is formed, or a boundary between the void domain and material domain, wherein a predetermined value between a value representing the material domain and a value representing the void domain represents a boundary of the structure;
wherein the CPU is configured to execute a level set function update part that, under a predetermined constraint condition, updates the level set function so as to bring a performance of the structure close to a target value, moves the boundary between the void domain and the material domain, allows a change in topology in the material domain to form a new void domain in the material domain, the change in topology being associated with the update of the level set function, and moves a boundary between the new void domain and the material domain;
wherein the level set function update part has an intermediate structure in which a number of holes of the void domain and new void domain is greater than a number of holes of the void domain of the initial structure;
wherein the level set function update part updates the level set function such that a degree of complexity indicating a structural complexity of a structure obtained as a result of updating the level set function is made to approach a preset degree of complexity, and a complexity degree coefficient which indicates the preset degree of complexity is set variably; and
wherein the level set function update part is configured to receive user input for the design domain data and the level set function data, and output a result on a display associated with the structural optimization device.

2. The structural optimization device according to claim 1, wherein
the level set function update part calculates, from an energy functional indicated by a function family using the level set function as a variable, an energy density in the material domain, an energy density in the void domain, and an interface energy density, and, according to an energy functional minimization principle, calculates a reaction-diffusion equation indicating a time evolution of the level set function, uses the reaction-diffusion equation to evolve the level set function in time, and thereby updates the level set function.

3. A structural optimization method comprising:
a design domain data inputting step of inputting design domain data indicating a design domain for a structure into a computer by input means;
a level set function inputting step of inputting level set function data into a computer by input means, the level set function data indicating whether each part of the design domain where an initial structure is set corresponds to a material domain where a structure is formed, a void domain where a void is formed, or a boundary between these two domains, wherein a predetermined value between a value representing the material domain and a value representing the void domain represents the boundary; and a level set function update step that, under a predetermined constraint condition, updates the level set function so as to bring a performance of the structure close to a target value by a level set function update part that is executed by the computer, and moves the boundary between the material domain and the void domain, allows a change in topology in the material domain to form a new void domain in the material domain, the change in topology being associated with the update of the level set function, and moves a boundary between the new void domain and the material domain, wherein the level set function update part updates the level set function such that a degree of complexity indicating a structural complexity of a structure obtained as a result of updating the level set function is made to approach a preset degree of complexity, and a complexity degree coefficient which indicates the preset degree of complexity is set variably.

4. A structural optimization program stored on a non-transitory computer readable medium and executed on a computer, which upon execution causes the computer to perform the following functions:

a design domain data storage part that stores design domain data indicating a design domain for a structure;

a level set function data storage part that stores level set function data that indicates a level set function that indicates whether each part of the design domain where an initial structure is set corresponds to a material domain where a structure is formed, a void domain where a void is formed, or a boundary between these two domains, wherein a predetermined value between a value representing the material domain and a value representing the void domain represents the boundary; and a level set function update part that, under a predetermined constraint condition, updates the level set function so as to bring a performance of the structure close to a target value, and moves the boundary between the material domain and the void domain, allows a change in topology in the material domain to form a new void domain in the material domain, the change in topology being associated with the update of the level set function, and moves a boundary between the new void domain and the material domain, wherein the level set function update part updates the level set function such that a degree of complexity indicating a structural complexity of a structure obtained as a result of updating the level set function is made to approach a preset degree of complexity, and a complexity degree coefficient which indicates the preset degree of complexity is set variably.

* * * * *